United States Patent [19]
Miyatake

[11] Patent Number: 5,295,094
[45] Date of Patent: Mar. 15, 1994

[54] MEMORY CIRCUIT
[75] Inventor: Hideshi Miyatake, Itami, Japan
[73] Assignee: Mitsubishi Denki Kabushiki Kaisha, Tokyo, Japan
[21] Appl. No.: 794,268
[22] Filed: Nov. 19, 1991
[30] Foreign Application Priority Data
Nov. 22, 1990 [JP] Japan .................................. 2-318895
[51] Int. Cl.$^5$ ................................................ G11C 7/06
[52] U.S. Cl. ..................................... 365/182; 365/207; 365/208
[58] Field of Search ............... 365/182, 189.01, 189.04, 365/189.05, 190, 207, 208, 230.06

[56] References Cited

U.S. PATENT DOCUMENTS

| | | | |
|---|---|---|---|
| 4,945,517 | 7/1990 | Miyatake et al. | 365/189.01 |
| 4,970,689 | 11/1990 | Kenney | 365/189.01 |
| 4,984,206 | 1/1991 | Kamatsu et al. | 365/208 |
| 5,075,887 | 12/1991 | Magome et al. | 365/189.01 |
| 5,079,748 | 1/1992 | Miyatake et al. | 365/189.01 |

FOREIGN PATENT DOCUMENTS 63-184991 7/1988 Japan ................. 365/189.01

OTHER PUBLICATIONS

Nakagome et al., "Low-Voltage High-Speed Circuit Technology for 64 Mb DRAMs", Society for Electronic Communication, IC Meeting, 1990.
Nakagome et al., 1987 Symposium on VLSI Circuits, pp. 17–18.
Yanagisawa et al., "A 23ns 1 Mbit BiCMOS DRAM", 1987 Symposium on VLSI Circuits, pp. 184–186.

*Primary Examiner*—Eugene R. LaRoche
*Assistant Examiner*—Tan Nguyen
*Attorney, Agent, or Firm*—Lowe, Price, LeBlanc & Becker

[57] ABSTRACT

A memory circuit incorporating a current-mirror type amplifier which directly amplifies a varied potential of a pair of bit lines. As soon as the word line goes High, the current-mirror type amplifier is simultaneously activated to amplify a minimal difference (100 mV) of potential between these bit lines. Data signal outputted from the current-mirror type amplifier is then transmitted to a read-only signal line. As a result, data is quickly read out before a built-in sense amplifier completes amplification, thus quickly achieving an accessing operation at extremely fast speed.

17 Claims, 7 Drawing Sheets

MEMORY CIRCUIT

BACKGROUND OF THE INVENTION

1. Field of the Invention

The present invention relates to a memory circuit which makes up a semiconductor dynamic RAM, more particularly, it relates to a memory circuit which is capable of executing accessing operations at extremely fast speed.

2. Description of Related Art

FIG. 1 schematically designates the block diagram of a conventional memory array. The reference numeral 1 shown in FIG. 1 designates an N-channel MOS transistor and the reference numeral 3 a sense amplifier. Gate of transistor 1 is connected to a work line WL, whereas source and drain of this transistor 1 are respectively connected to a capacitor 2 and a bit line B. The bit line B, the other bit line $\bar{B}$, and a sense amplifier activating signal line SO, are respectively connected to the sense amplifier 3. The reference numerals 4 and 5 respectively designate N-channel MOS transistors each functioning as a transfer gate. Data signal "y" outputted from a conventional column decoder shown in FIG. 2 is inputted to gates of those transistors 4 and 5. The conventional column decoder shown in FIG. 2 incorporates a NAND circuit 23 and a NOT circuit 24 which are connected to each other in series. The NAND circuit 23 receives column address Ai. Source and drain of the N-channel MOS transistor 4 are respectively connected to the bit line B and a write/read signal line I/O. On the other hand, source and drain of the other N-channel MOS transistor 5 are respectively connected to the bit line $\bar{B}$ and the other write/read signal line $\overline{I/O}$. A write buffer 21 and a read pre-amplifier 22 are respectively connected to the write/read signal lines I/O and $\overline{I/O}$.

Referring now to the waveform chart shown in FIG. 3, functional operation of the conventional memory array incorporating the above structure is described below. The following description specifically refers to the bit-line pre-charging system applying ½ Vcc (Vcc: power voltage).

Initially, a pair of bit lines B and $\bar{B}$ are preliminarily charged with ½ Vcc. Next, one word line WL is selected by a low address, and then the selected word line WL goes High. As a result, capacitor 2 delivers a data signal to the bit line B, where the data signal contains "HIGH" information. This causes potential of the bit line B to become slightly higher than that of the other bit line $\bar{B}$ by about 100 mV. Next, the sense amplifier activating signal line SO goes High. This causes the sense amplifier 3 to amplify the potential of the High-level bit line B up to the Vcc potential and the Low-level bit line $\bar{B}$ down to the GND potential. This completes a refreshing operation f a dynamic RAM. Next, column address Ai turns the data "y" outputted from one column decoder High so that the output data "y" can be delivered to a pair of write/read signal lines I/O and $\overline{I/O}$. The delivered data signal is then amplified by the read pre-amplifier 22 before being outputted from the dynamic RAM. On the other hand, data signal "y" outputted from the column decoder goes High, and then, data is written from the write buffer 21. These are the functional operations of the conventional operations of the conventional dynamic RAM for reading and writing data.

Since the conventional memory circuit incorporates the structure mentioned above, after completing data amplification by the sense amplifier, data signal is delivered to the write/read signal lines I/O and $\overline{I/O}$. Because of this, any conventional dynamic RAM has those lines each containing substantial capacity. This in turn obliges the conventional system to take much time to execute amplification, thus eventually resulting in the delayed accessing operation. As a result, there is still substantial restriction to contract the cyclic time of the convention dynamic RAM.

To solve this problem, there is an idea to simultaneously activate the column decoder and the word line so that the accessing operation can be accelerated. Nevertheless, if the column decoder and the word line were simultaneously activated, since the bit line B is connected to the write/read signal line I/O containing substantial parasitic capacity, the bit-line capacity easily expands to merely lower the reading voltage. This in turn causes the memory system to easily malfunction itself. In consequence, any of those conventionally available memory systems cannot achieve accelerated accessing operation.

SUMMARY OF THE INVENTION

The invention fully solves those problems cited above by providing a novel memory circuit incorporating a current-mirror type amplifier which directly amplifies varied potential of bit lines. As soon as the word line goes High, the current-mirror type amplifier is simultaneously activated to amplify minimal difference (100 mV) of potential between a pair of bit lines. As a result, the output from the current-mirror type amplifier is delivered to a data reading signal lien. In other words, data is read before the sense amplifier completes amplification of data, thus permitting the memory circuit to very quickly execute accessing operation in an extremely short period of time.

The primary object of the invention is to provide a novel memory circuit capable of quickly executing accessing operation at fast speed.

Another object of the invention is to provide a novel memory circuit capable of drastically contracting cycle time.

A still further object of the invention is to provide a novel memory circuit capable of drastically contracting dimension of the whole circuit by arranging the current-mirror type amplifier to share common load with the read-only signal line.

The above and further objects and features of the invention will more fully be apparent from the following detailed description with accompanying drawings.

DESCRIPTION OF THE PREFERRED EMBODIMENTS

Referring now to the accompanying drawings, the memory circuit according to an embodiment of the invention is described below.

Figure 1:
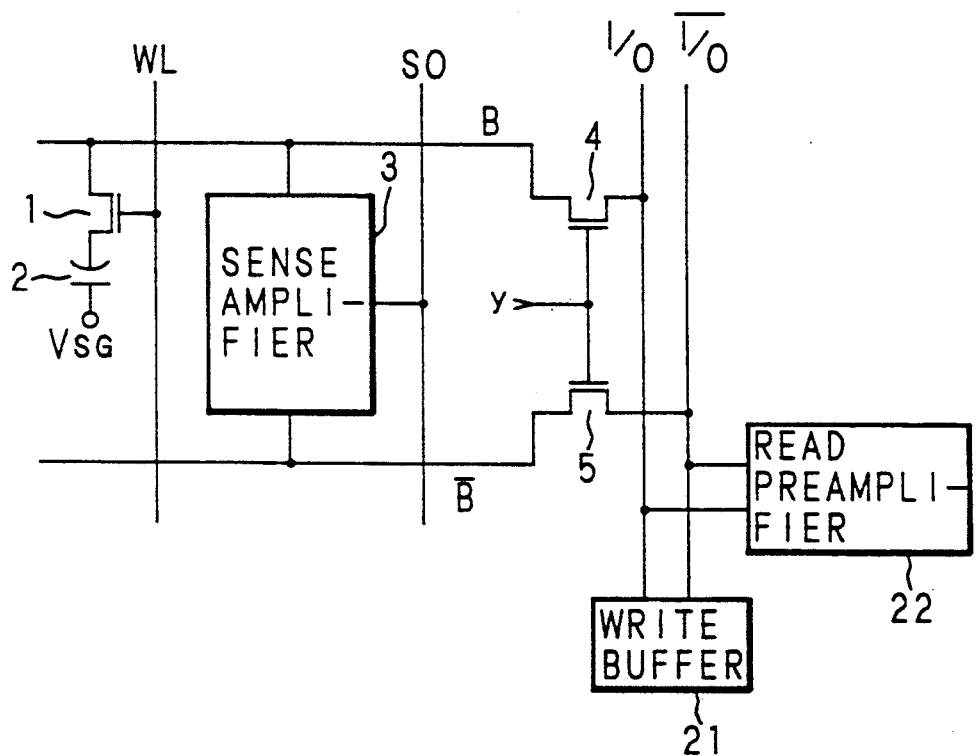
FIG. 1 schematically designates the circuit block diagram of a conventional memory array.
Figure 2:
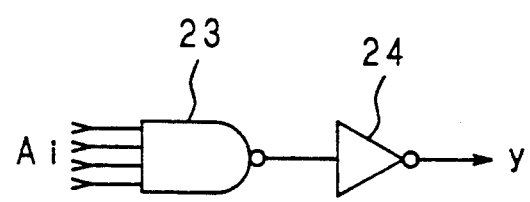
FIG. 2 schematically designates the block diagram of the column decoder of a conventional memory array.
Figure 3:
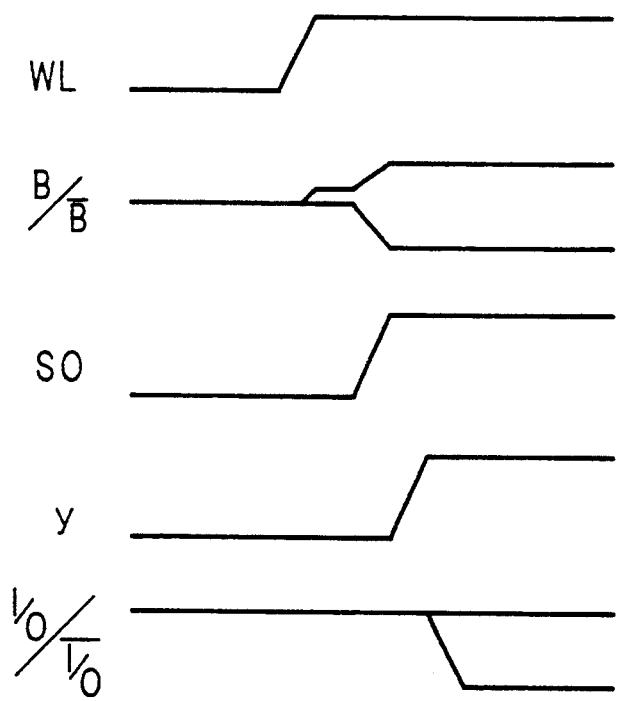
FIG. 3 designates waveforms of a conventional memory array shown in FIG. 1.
Figure 4:
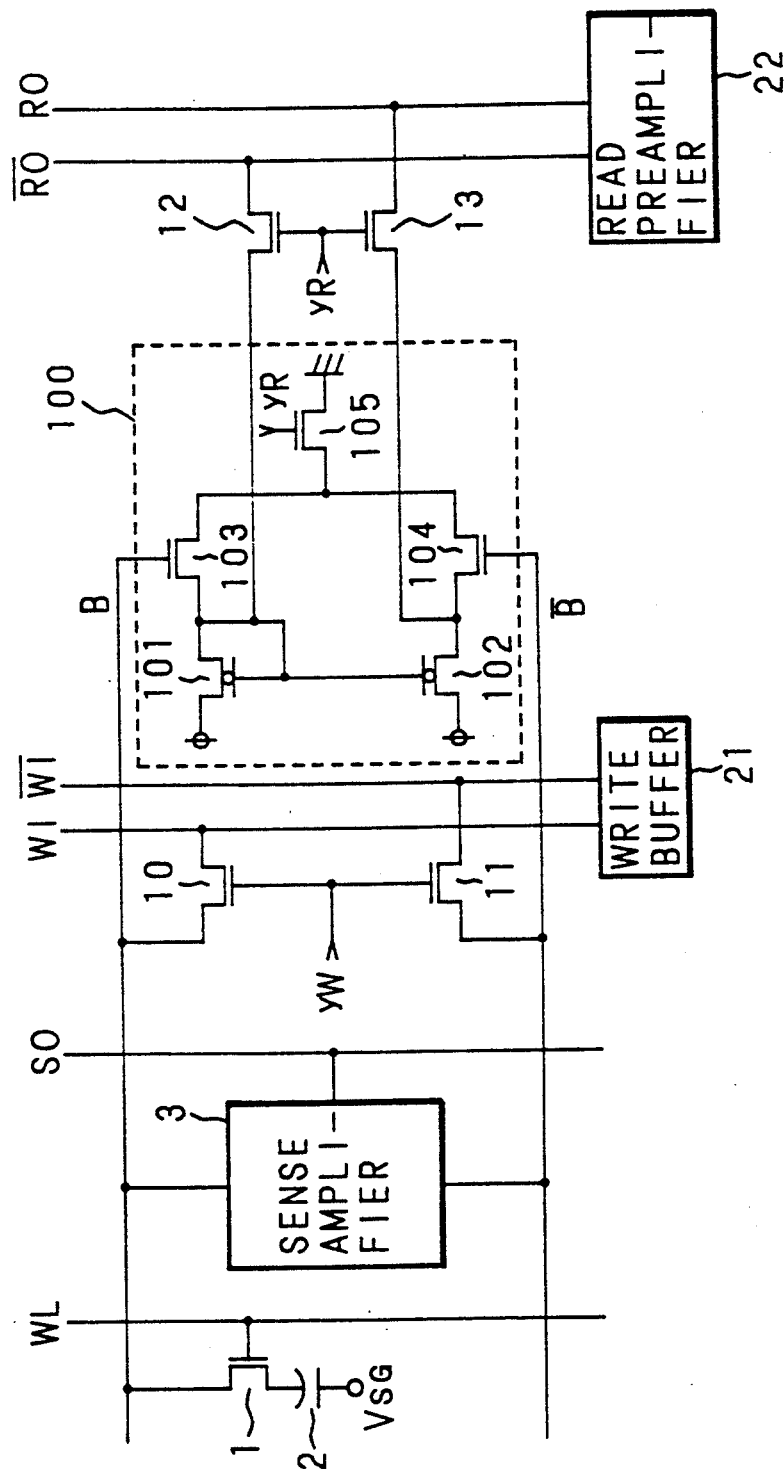
FIG. 4 schematically designates the circuit block diagram of the memory array according to an embodiment of the invention.

FIG. 4 schematically designates the circuit block diagram of the memory array according to an embodiment of the invention. The reference number 1 shown in FIG. 4 designates an N-channel MOS transistor, whereas the reference numeral 3 designates a sense amplifier, respectively. Gate of this transistor 1 is connected to a word line WL, whereas the source and drain of this transistor 1 are respectively connected to a capacitor 2 and a bit line B. The bit line B, the other bit line $\overline{B}$, and a sense amplifier activating signal line SO, are respectively connected the sense amplifier 3. The reference numerals 10 and 11 respectively designates N-channel MOS transistors which function themselves as a transfer gate. Gates of these transistors 10 and 11 respectively receive an output signal "yW" which is activated while the column decoder shown in FIG. 5 is engaged in the writing mode.

Figure 5:
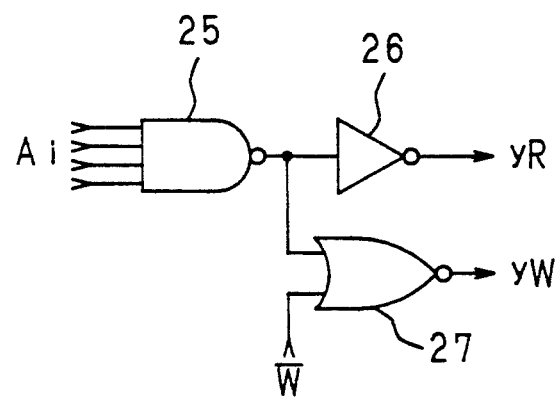
FIG. 5 schematically designates the block diagram of the column decoder of the memory array according to an embodiment of the invention.

The column decoder shown in FIG. 5 comprises a NAND circuit 25 receiving column address Ai, a NOT circuit 26 and a NOR circuit 27 which are respectively connected to the output terminal of the NAND circuit 25 in parallel with each other. The other input terminal of the NOR circuit 27 receives an inverting signal "$\overline{W}$" available for the writing-mode activating signal. The NOT circuit 26 and the NOR circuit 27 respectively output a signal "yR" which is activated in the course of reading mode and the signal "yW" which is activated in the course of writing mode.

The bit line B and a write-only signal line WI are respectively connected to the source and drain of the transistor 10. On the other hand, the other bit line $\overline{B}$ and the other write-only signal line $\overline{WI}$ are respectively connected to the source and drain of the transistor 11. A write buffer 21 is connected to the write-only signal lines WI and $\overline{WI}$.

The reference numeral 100 shown in FIG. 4 designates a current-mirror type amplifier incorporating P-channel MOS transistors 101 and 102 and transistors 103, 104 and 105. Gate of the transistor 105 receives the output signal "yR" from the column decoder shown in FIG. 5, where the output signal "yR" is activated while the reading mode is underway. Gates of those transistors 103 and 104 are respectively connected to the bit line B and the other bit line $\overline{B}$. Those transistors 103, 104 and 105 are respectively connected to each other. On the other hand, those transistors 101, 102, 103 and 104, are respectively connected to each other as shown in FIG. 4. Gates of those transistors 101 and 102 are connected to each other.

The reference numerals 12 and 13 respectively designate N-channel MOS transistors which function themselves as a transfer gate. Gates of these transistors 12 and 13 respectively receive the output signal "yR" which is activated while the column decoder embodied by the invention is engaged in the reading mode. Source of transistor 12 is connected to those transistors 101 and 103, whereas drain of the transistor 12 is connected to a read-only signal line RO. On the other hand, source of the transistor 13 is connected to those transistors 102 and 104, whereas drain of the transistor 13 is connected to the other read-only signal line $\overline{RO}$. A read preamplifier 22 is connected to those read-only signal lines RO and $\overline{RO}$.

Figure 6:
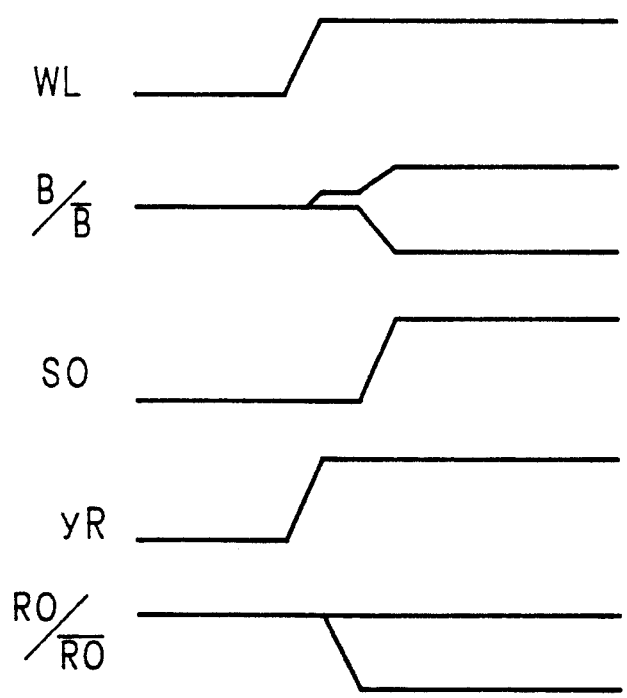
FIG. 6 designates waveforms of the memory array shown in FIG. 4.

Next, referring now to the waveform chart shown in FIG. 6, functional operation of the memory array featuring the above structure is described below.

Like the conventional memory array cited earlier, the memory array embodied by the invention also executes a refreshing operation as soon as the word line WL and the sense amplifier activating signal line SO respectively turn to High. Therefore, description of the refreshing operation is deleted. Functional operation of the memory array of the invention for reading and writing data is described below.

When the word line WL goes High, data flows into the bit line B. As a result, potential of a pair of bit lines B and $\overline{B}$ slightly varies. Simultaneously, the signal "yR" outputted from the column decoder shown in FIG. 5 goes High, thus activating the current-mirror type amplifier 100. In this way, both the word line WL and the current-mirror type amplifier 100 are simultaneously activated. According to the embodiment of the invention, bit-line potential is delivered to the gate of the current-mirror type amplifier 100. This prevents the bit-line capacity from expanding itself, and as a result, both the word line WL and the current-mirror amplifier 100 is routed to the read-only signal lines RO and $\overline{RO}$, and then, the data signal is amplified by the read preamplifier 22 before being outputted. In consequence, time needed for executing an accessing operation is significantly shortened.

On the other hand, while the writing mode is underway, initially, the word line WL goes High to simultaneously activate the column decoder, and at the same time, the inverting signal "$\overline{W}$" available for the writing-mode activating signal goes Low. This in turn causes the column decoder to output a high signal yW, thus permitting the write buffer 21 to write data via the write-only signal lines WI and $\overline{WI}$.

In this way, the memory array embodied by the invention can more quickly execute the reading and writing operations. In this way, the invention has provided a novel memory circuit capable of very quickly executing the writing and reading operations by sharply contracting the cycle time.

According to the composition of the memory circuit embodied by the invention, since the current-mirror type amplifier 100 amplifies the bit line potential, provision of the sense amplifier 3 may be considered unnecessary. Nevertheless, as mentioned earlier, in order to properly amplify memory-cell data before refreshing the memory cell up to the Vcc potential or down to the GND potential, provision of the sense amplifier 100 amplifies the bit-line potential and then delivers the amplified potential to the read-only signal lines RO and $\overline{RO}$, it does not feed the amplified potential back to the memory cell.

Figure 7:
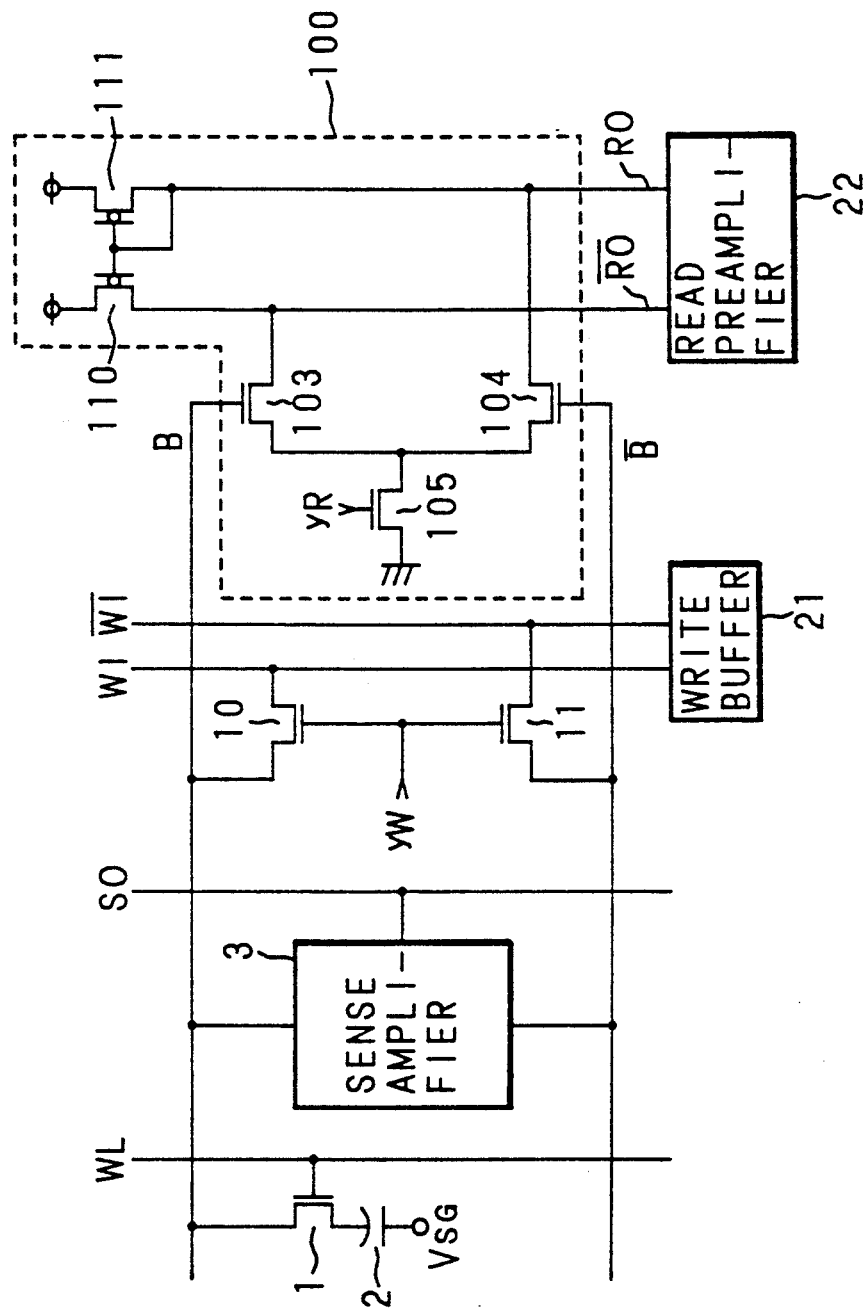
FIG. 7 schematically designates the circuit block diagram of the memory array according to another embodiment of the invention.

FIG. 7 schematically designates the circuit block diagram of the memory array according to another embodiment of the invention. The preceding embodiment provides a current-mirror type amplifier for a pair of bit lines. Instead, like the other embodiment shown in FIG. 7, a driver unit may discretely be provided for the current-mirror type amplifier 100, and yet, a load-sharing part may also be provided. Concretely, those N-channel MOS transistors 103 through 105 conjunctionally compose the driver unit, whereas those P-channel MOS transistors 110 and 111 conjunctionally compose the load-sharing part. Note that those components shown in FIG. 7 identical to those shown in FIG. 4 are respectively designated by identical reference numerals. Since the memory array shown in FIG. 7 incorporates the load-sharing part, the memory circuit can more compactly be structured than that provided the preceding embodiment. The memory array shown in FIG. 7 executes the writing and reading operations exactly in the same way as was done for the preceding embodiment, and therefore, description of the functional operation of the memory array shown in FIG. 7 is deleted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A memory circuit having a memory cell which is connected to a bit line and a word line comprising:
   a read-only signal line for transmitting a signal read out from said memory cell; and
   a current-mirror type amplifier disposed between said bit line and said read-only signal line;
   activating means for simultaneously activating said word line and said current-mirror type amplifier.

2. A memory circuit as set forth in claim 1, wherein said activating means comprises first means for applying a voltage transition to said current mirror amplifier simultaneously with a voltage transition occurring on said word line.

3. A memory circuit as set forth in claim 1, further comprising:
   a write-only signal line for transmitting a signal to be stored in said memory cell;
   a first transfer gate having first and second main terminals connected to said bit line and said write-only signal line, said first mentioned transfer gate being responsive only to a write signal establishing a write mode for establishing contact between said first and second main terminals thereof; and
   a second transfer gate having first and second main terminals connected to an output of said current mirror amplifier and to said read-only signal line and a control terminal responsive to a control signal for establishing electrical connection therebetween, said second transfer gate being responsive to a read signal establishing a read mode for connecting said output of said current mirror amplifier to said read-only signal line thereof.

4. A memory circuit as set forth in claim 3, wherein said first and second main terminals of said second transfer gate are connected directly to the output of the current mirror and the read-only signal line and said second transfer gate is activated only by the read signal to establish electrical connection therebetween.

5. A memory circuit as set forth in claim 1, comprising a plurality of memory cells respectively connected to a plurality of bit lines and a plurality of word lines, said memory circuit including a plurality of current-mirror type amplifiers in respective correspondence to each of said plurality of bit lines.

6. A memory circuit as set forth in claim 5, wherein each of said plurality of current-mirror type amplifiers is disposed between a respective one of said plurality of bit lines and said read-only signal line.

7. A memory circuit having a memory cell which is connected to a bit line and a word line comprising:
   a first signal line which is solely available for reading data and transmits a signal read out from said memory cell; and
   a current-mirror type amplifier disposed between said bit line and said first signal line;
   a second signal line which is solely available for writing data and transmits a signal to be written in said memory cell; and
   a transfer gate which is disposed between said bit line and said second signal line;
   activating means for simultaneously activating said word line and said current-mirror type amplifier.

8. A memory circuit as set forth in claim 7, wherein said activating means comprises first means for applying a voltage transition to said current mirror amplifier simultaneously with a voltage transition occurring on said word line.

9. A memory circuit as set forth in claim 7, further comprising a second transfer gate connected between an output of said current mirror amplifier and said first signal line,
   wherein said first mentioned transfer gate has a pair of main conduction terminals respectively directly connected to said bit line and said second signal line, and said first mentioned transfer gate is responsive only to a write signal establishing a write mode for establishing contact between said main conduction terminals thereof, and
   said second transfer gate is responsive to a read signal establishing a read mode for connecting said output of said current mirror amplifier to said first signal line thereof.

10. A memory circuit as set forth in claim 9, wherein said second transfer gate has a pair of main conduction terminals connected directly to the output of the current mirror and the first signal line and being activated only by the read signal to establish electrical connection therebetween.

11. A memory circuit as set forth in claim 7, comprising a plurality of memory cells respectively connected to a plurality of bit lines and a plurality of word lines, said memory circuit including a plurality of current-mirror type amplifiers in respective correspondence to each of said plurality of bit lines.

12. A memory circuit as set forth in claim 11, wherein each of said plurality of current-mirror type amplifiers is disposed between a respective one of said plurality of bit lines and said read-only signal line.

13. A memory circuit having a memory cell which is connected to a bit line and a word line comprising:
   a current-mirror type amplifier which is connected to a pair of bit lines;
   a pair of first signal lines which are solely available for reading data and transmit a signal read out from said memory cell;
   a pair of the second signal lines which are solely available for writing data and transmit a signal to be written in said memory cell;
   a column decoder which activates said current-mirror type amplifier and generates a first output in the course of reading mode and a second output in the course of writing mode;

a first transfer gate which receives said first output from said column decoder and is connected to said pair of the first signal lines; and a second transfer gate which receives said second output from said column decoder and is connected to said pair of the second signal lines;

said word line and said current-mirror type and amplifier being simultaneously activated.

14. A memory circuit as set forth in claim 13, further comprising a sense amplifier which is connected to said pair of bit lines and amplifies a signal received via said pair of bit lines.

15. A memory circuit as set forth in claim 13, wherein said current-mirror type amplifier shares a common load with said pair of the first signal lines.

16. A memory circuit as set forth in claim 13, further comprising activating means for simultaneously activating said current-mirror type amplifier and said word line.

17. A memory circuit as set forth in claim 12, wherein said activating means comprises voltage generating means for applying a voltage transition to said current mirror amplifier simultaneously with a voltage transition occurring on said word line.

* * * * *